United States Patent
Seeber et al.

(10) Patent No.: US 7,868,617 B2
(45) Date of Patent: Jan. 11, 2011

(54) COOLING SYSTEM AND APPARATUS FOR CONTROLLING DRIFT OF A MAIN MAGNETIC FIELD IN AN MRI SYSTEM

(75) Inventors: Derek A. Seeber, Florence, SC (US); Tomas Duby, Florence, SC (US)

(73) Assignee: General Electric Co., Schenectady, NY (US)

( * ) Notice: Subject to any disclaimer, the term of this patent is extended or adjusted under 35 U.S.C. 154(b) by 518 days.

(21) Appl. No.: 11/940,819

(22) Filed: Nov. 15, 2007

(65) Prior Publication Data
US 2009/0128269 A1    May 21, 2009

(51) Int. Cl.
*G01V 3/00*    (2006.01)
(52) U.S. Cl. .................................. 324/318; 324/319
(58) Field of Classification Search ............. 324/318, 324/319, 322
See application file for complete search history.

(56) References Cited

U.S. PATENT DOCUMENTS

| | | | |
|---|---|---|---|
| 5,424,643 A | 6/1995 | Morich et al. | |
| 6,011,394 A | 1/2000 | Petropoulos et al. | |
| 6,297,634 B1 * | 10/2001 | Aoki | 324/315 |
| 6,552,545 B2 | 4/2003 | Kaindl et al. | |
| 6,771,072 B2 | 8/2004 | Schuster et al. | |
| 6,788,060 B1 | 9/2004 | Feenan et al. | |
| 6,812,705 B1 | 11/2004 | Sellers | |
| 6,909,283 B2 * | 6/2005 | Emeric et al. | 324/300 |
| 6,992,483 B1 | 1/2006 | Emeric et al. | |
| 7,015,692 B2 | 3/2006 | Clarke et al. | |
| 7,135,863 B2 | 11/2006 | Arik et al. | |
| 7,180,292 B2 | 2/2007 | Coughlin | |
| 7,193,416 B2 | 3/2007 | Harvey et al. | |
| 7,301,343 B1 | 11/2007 | Sellers | |
| 2001/0042385 A1 | 11/2001 | Kaindl et al. | |
| 2002/0156595 A1 | 10/2002 | Hedlund et al. | |
| 2005/0030028 A1 | 2/2005 | Clarke et al. | |
| 2005/0035764 A1 | 2/2005 | Mantone et al. | |
| 2005/0104701 A1 | 5/2005 | Huang et al. | |
| 2005/0179512 A1 | 8/2005 | Weyers et al. | |
| 2007/0080689 A1 | 4/2007 | Konijn et al. | |

FOREIGN PATENT DOCUMENTS

| | | |
|---|---|---|
| JP | 08080289 | 3/1996 |
| JP | 10225446 | 8/1998 |

\* cited by examiner

*Primary Examiner*—Louis M Arana

(57) ABSTRACT

An apparatus for controlling a temperature of a warm bore of a superconducting magnet in a magnetic resonance imaging (MRI) system includes a cooling tube that is mounted on a surface of the warm bore and is configured to transport a coolant. A chiller is coupled to the cooling tube and is configured to provide the coolant to the cooling tube. A controller is coupled to the chiller and is configured to provide a control signal to the chiller to control a temperature of the coolant.

20 Claims, 5 Drawing Sheets

COOLING SYSTEM AND APPARATUS FOR CONTROLLING DRIFT OF A MAIN MAGNETIC FIELD IN AN MRI SYSTEM

FIELD OF THE INVENTION

The present invention relates generally to a magnetic resonance imaging (MRI) system and in particular to a cooling system and apparatus for controlling drift of a main magnetic field, Bo, during operation of an MRI system.

BACKGROUND OF THE INVENTION

Magnetic resonance imaging (MRI) is a medical imaging modality that can create pictures of the inside of a human body without using x-rays or other ionizing radiation. MRI uses a powerful magnet to create a strong, uniform, static magnetic field (i.e., the "main magnetic field"). When a human body, or part of a human body, is placed in the main magnetic field, the nuclear spins that are associated with the hydrogen nuclei in tissue water become polarized. This means that the magnetic moments that are associated with these spins become preferentially aligned along the direction of the main magnetic field, resulting in a small net tissue magnetization along that axis (the "z axis," by convention). An MRI system also comprises components called gradient coils that produce smaller amplitude, spatially varying magnetic fields when a current is applied to them. Typically, gradient coils are designed to produce a magnetic field component that is aligned along the z axis, and that varies linearly in amplitude with position along one of the x, y or z axes. The effect of a gradient coil is to create a small ramp on the magnetic field strength, and concomitantly on the resonant frequency of the nuclear spins, along a single axis. Three gradient coils with orthogonal axes are used to "spatially encode" the MR signal by creating a signature resonance frequency at each location in the body. Radio frequency (RF) coils are used to create pulses of RF energy at or near the resonance frequency of the hydrogen nuclei. The RF coils are used to add energy to the nuclear spin system in a controlled fashion. As the nuclear spins then relax back to their rest energy state, they give up energy in the form of an RF signal. This signal is detected by the MRI system and is transformed into an image using a computer and known reconstruction algorithms.

MRI systems require a uniform main magnetic field, Bo, in the imaging volume that should remain homogeneous and constant in time over a wide range of pulse sequences and protocols. Changes or drift in the main magnetic field can affect the performance of the MRI system including data acquisition and reconstruction of an MR image. During a patient scan, the gradient coil(s) of the gradient coil assembly, which produce the magnetic field gradients, dissipate large amounts of heat. The heat produced by the gradient coils can cause an increase in temperature of the magnet warm bore, for example, by radiation, convection or conduction heating. In addition, the magnet warm bore temperature may increase as a result of eddy currents. A magnet warm bore surface is typically made of low magnetic permeability stainless steel, however, the stainless steel may have residual permeability, also known as paramagnetism. According to Curie's law, the permeability of a paramagnetic material changes as the temperature of the material changes. Accordingly, the heating of the magnet's stainless steel warm bore due to the heat generated by the gradient coils and eddy currents changes the permeability of the stainless steel warm bore. Typically, the permeability of the warm bore will decrease as the temperature of the warm bore increases. The change in permeability of the magnet warm bore can result in a change or drift in the main magnetic field which in turn can have a negative impact on image quality.

It would be desirable to provide a system, method and apparatus for controlling the change or drift of the main magnetic field. It would be advantageous to control or compensate for the change or drift of the main magnetic field based on the temperature and permeability of the magnet warm bore.

BRIEF DESCRIPTION OF THE INVENTION

In accordance with an embodiment, an apparatus for controlling a temperature of a warm bore of a superconducting magnet in a magnetic resonance imaging (MRI) system includes a cooling tube positioned on a surface of the warm bore and configured to transport a coolant, a chiller coupled to the cooling tube and configured to provide the coolant to the cooling tube and a controller coupled to the chiller and configured to provide a control signal to the chiller to control the temperature of the coolant.

In accordance with another embodiment, a magnet assembly for a magnetic resonance imaging (MRI) system includes a superconducting magnet comprising a magnet vessel containing at least one superconducting coil and having an inner diameter surface and a cooling apparatus mounted to and in thermal contact with the inner diameter surface of the magnet vessel.

BRIEF DESCRIPTION OF THE DRAWINGS

The invention will become more fully understood from the following detailed description, taken in conjunction with the accompanying drawings, wherein like reference numerals refer to like parts, in which.

DETAILED DESCRIPTION

Figure 1:
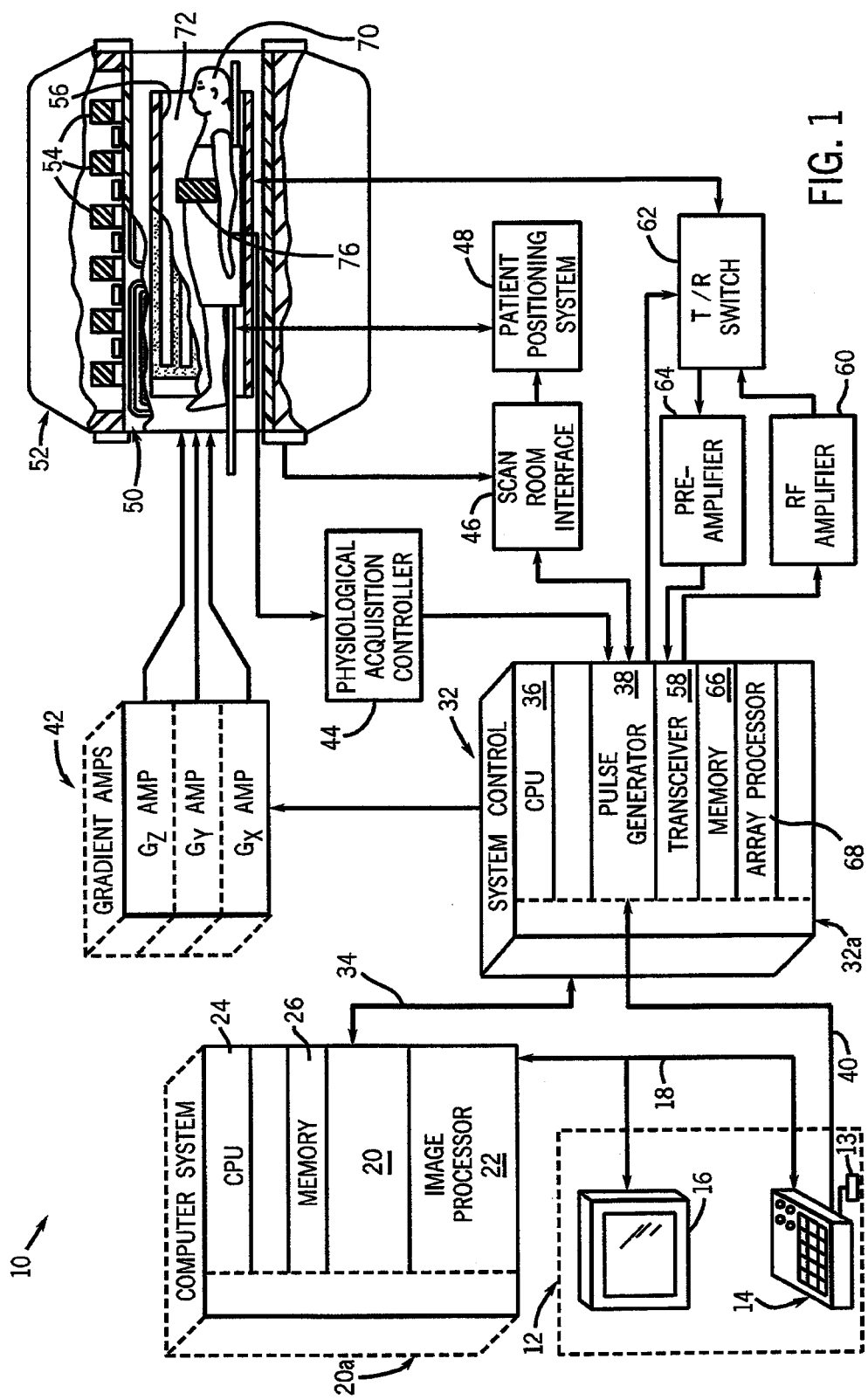
FIG. 1 is a schematic block diagram of an exemplary magnetic resonance imaging system in accordance with an embodiment.

FIG. 1 is a schematic block diagram of an exemplary magnetic resonance imaging system in accordance with an embodiment. The operation of MRI system 10 is controlled from an operator console 12 that includes a keyboard or other input device 13, a control panel 14, and a display 16. The console 12 communicates through a link 18 with a computer system 20 and provides an interface for an operator to prescribe MRI scans, display resultant images, perform image processing on the images, and archive data and images. The computer system 20 includes a number of modules that communicate with each other through electrical and/or data connections, for example, such as are provided by using a backplane 20a. Data connections may be direct wired links or may be fiber optic connections or wireless communication links or the like. The modules of the computer system 20 include an image processor module 22, a CPU module 24 and a memory module 26 which may include a frame buffer for storing image data arrays. In an alternative embodiment, the image processor module 22 may be replaced by image processing functionality on the CPU module 24. The computer system 20 is linked to archival media devices, permanent or back-up memory storage or a network. Computer system 20 may also communicate with a separate system control computer 32 through a link 34. The input device 13 can include a mouse, joystick, keyboard, track ball, touch activated screen, light wand, voice control, or any similar or equivalent input device, and may be used for interactive geometry prescription.

The system control computer 32 includes a set of modules in communication with each other via electrical and/or data connections 32a. Data connections 32a may be direct wired links, or may be fiber optic connections or wireless communication links or the like. In alternative embodiments, the modules of computer system 20 and system control computer 32 may be implemented on the same computer system or a plurality of computer systems. The modules of system control computer 32 include a CPU module 36 and a pulse generator module 38 that connects to the operator console 12 through a communications link 40. The pulse generator module 38 may alternatively be integrated into the scanner equipment (e.g., magnet assembly 52). It is through link 40 that the system control computer 32 receives commands from the operator to indicate the scan sequence that is to be performed. The pulse generator module 38 operates the system components that play out (i.e., perform) the desired pulse sequence by sending instructions, commands and/or requests (e.g., radio frequency (RF) waveforms) describing the timing, strength and shape of the RF pulses and pulse sequences to be produced and the timing and length of the data acquisition window. The pulse generator module 38 connects to a gradient amplifier system 42 and produces data called gradient waveforms which control the timing and shape of the gradient pulses that are to be used during the scan. The pulse generator module 38 may also receive patient data from a physiological acquisition controller 44 that receives signals from a number of different sensors connected to the patient, such as ECG signals from electrodes attached to the patient. The pulse generator module 38 connects to a scan room interface circuit 46 that receives signals from various sensors associated with the condition of the patient and the magnet system. It is also through the scan room interface circuit 46 that a patient positioning system 48 receives commands to move the patient table to the desired position for the scan.

The gradient waveforms produced by the pulse generator module 38 are applied to gradient amplifier system 42 which is comprised of $G_x$, $G_y$, and $G_z$ amplifiers. Each gradient amplifier excites a corresponding physical gradient coil in a gradient coil assembly generally designated 50 to produce the magnetic field gradient pulses used for spatially encoding acquired signals. The gradient coil assembly 50 forms part of a magnet assembly 52 that includes a polarizing superconducting magnet with superconducting main coils 54. Magnet assembly 52 may include a whole-body RF coil 56, surface or parallel imaging coils 76 or both. The coils 56, 76 of the RF coil assembly may be configured for both transmitting and receiving or for transmit-only or receive-only. A patient or imaging subject 70 may be positioned within a cylindrical patient imaging volume 72 of the magnet assembly 52. A transceiver module 58 in the system control computer 32 produces pulses that are amplified by an RF amplifier 60 and coupled to the RF coils 56, 76 by a transmit/receive switch 62. The resulting signals emitted by the excited nuclei in the patient may be sensed by the same RF coil 56 and coupled through the transmit/receive switch 62 to a preamplifier 64. Alternatively, the signals emitted by the excited nuclei may be sensed by separate receive coils such as parallel coils or surface coils 76. The amplified MR signals are demodulated, filtered and digitized in the receiver section of the transceiver 58. The transmit/receive switch 62 is controlled by a signal from the pulse generator module 38 to electrically connect the RF amplifier 60 to the RF coil 56 during the transmit mode and to connect the preamplifier 64 to the RF coil 56 during the receive mode. The transmit/receive switch 62 can also enable a separate RF coil (for example, a parallel or surface coil 76) to be used in either the transmit or receive mode.

The MR signals sensed by the RF coil 56 are digitized by the transceiver module 58 and transferred to a memory module 66 in the system control computer 32. Typically, frames of data corresponding to MR signals are stored temporarily in the memory module 66 until they are subsequently transformed to create images. An array processor 68 uses a known transformation method, most commonly a Fourier transform, to create images from the MR signals. These images are communicated through the link 34 to the computer system 20 where it is stored in memory. In response to commands received from the operator console 12, this image data may be archived in long-term storage or it may be further processed by the image processor 22 and conveyed to the operator console 12 and presented on display 16.

Figure 2:
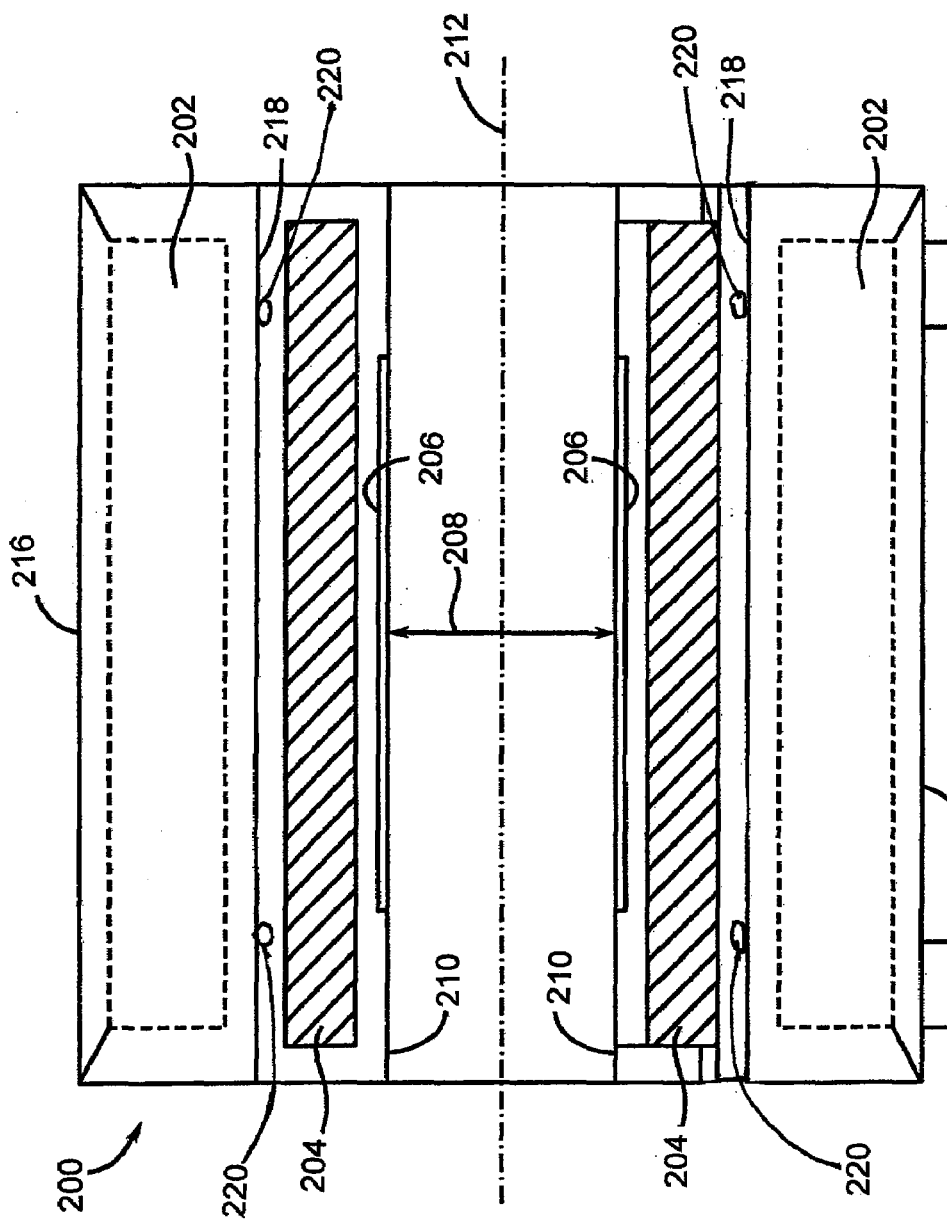
FIG. 2 is a cross-sectional side elevation view of an exemplary magnet assembly in accordance with an embodiment.

FIG. 2 is a schematic cross-sectional side elevation view of an exemplary magnet assembly (e.g., magnet assembly 52 shown in FIG. 1) in accordance with an embodiment. Magnet assembly 200 is cylindrical and annular in shape and is compatible with the above-described MRI system of FIG. 1 or any similar or equivalent system for obtaining MR images. While the following describes a cylindrical magnet assembly topology, it should be understood that other magnet assembly topologies may utilize the embodiments of the invention described herein. Magnet assembly 200 includes, among other elements, a superconducting magnet 202, a gradient coil assembly 204 and an RF coil 206. Various other elements, such as magnet coils, cryostat elements, supports, suspension members, end caps, brackets, etc. are omitted from FIG. 2 for clarity. A cylindrical patient volume or space 208 is surrounded by a patient bore tube 210. RF coil 206 is mounted on an outer surface of the patient bore tube 210 and mounted inside the gradient coil assembly 204. The gradient coil assembly 204 is disposed around the RF coil 206 in a spaced apart coaxial relationship and the gradient coil assembly 204 circumferentially surrounds the RF coil 206. Gradient coil assembly 204 is mounted inside a warm bore 218 of the magnet 202 and is circumferentially surrounded by magnet 202.

A patient or imaging subject 70 (shown in FIG. 1) may be inserted into the magnet assembly 200 along a center axis 212 (e.g., a z-axis) on a patient table or cradle (not shown in FIG. 2). Center axis 212 is aligned along the tube axis of the magnet assembly 200 parallel to the direction of a main magnetic field, $B_0$, generated by the magnet 202. RF coil 206 is used to apply a radio frequency pulse (or a plurality of pulses) to a patient or subject and to receive MR information back from the subject. Gradient coil assembly 204 generates time dependent gradient magnetic pulses that are used to spatially encode points in the imaging volume 208.

Superconducting magnet 202 may include, for example, several radially aligned and longitudinally spaced-apart superconductive main coils (not shown), each capable of carrying a large, identical electric current. The superconductive main coils are designed to create a magnetic field, Bo, within the patient volume 208. Superconducting magnet 202 is enclosed in a cryogenic environment within a magnet vessel 216 (or cryostat) designed to maintain the temperature of the superconductive coils below the appropriate critical temperature so that the coils are in a superconducting state with zero resistance. Magnet vessel 216 may include, for example, a helium vessel and thermal or cold shields for containing and cooling the magnet coils in a known manner. The warm bore 218 is defined by an inner cylindrical surface of the magnet vessel (or vacuum vessel) 216 and is typically made of metal such as stainless steel.

Heat dissipated from the gradient coil assembly 204 during operation may increase the temperature of the warm bore 218 (e.g., by radiation, convection or conduction) of the magnet assembly 200. The warm bore 218 may also be heated as a result of eddy currents generated during operation of the gradient coil assembly 204. As the temperature of the warm bore 218 increases, the permeability of the warm bore changes (typically decreases in accordance with Curie's Law) which can result in a change or drift in the main magnetic field, Bo. Thus, the main magnetic field may increase with increased temperature and decreased permeability of the warm bore 218. In order to control (e.g., to minimize) the change or drift in the main magnetic field resulting from a temperature induced change in permeability, the temperature of the warm bore 218 is maintained at a constant temperature.

Figure 3:
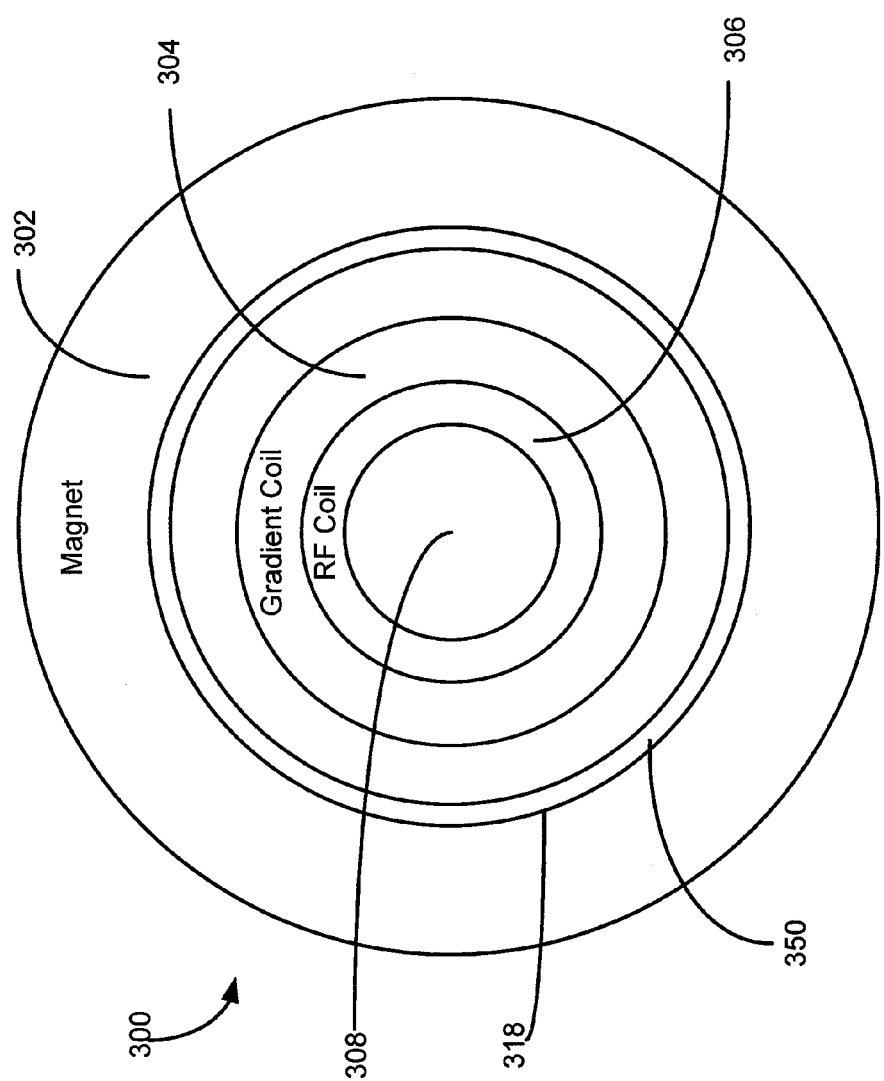
FIG. 3 is a schematic cross-sectional diagram of a magnet assembly showing the relative positions of various elements including a cooling apparatus in accordance with an embodiment.

The temperature of the warm bore 218 may be maintained at a constant temperature by using a cooling apparatus mounted on the warm bore. FIG. 3 is a schematic cross-sectional diagram of a magnet assembly showing the relative positions of various elements including a cooling apparatus in accordance with an embodiment. Magnet assembly 300 includes, among other elements, a superconducting magnet 302, a gradient coil assembly 304, an RF coil 306 and a patient volume or space 308. A cooling apparatus 350 is attached to an inner surface (or diameter) of a warm bore 318 of the magnet 302. The cooling apparatus 350 is configured to provide sufficient cooling to remove heat deposited on the surface of the warm bore 318 by the gradient coil 304 and maintain the temperature of the warm bore 318 at a predetermined temperature to limit the drift of the main magnetic field. Cooling apparatus 350 may also reduce the heat distributed to the patient volume 308.

Figure 4:
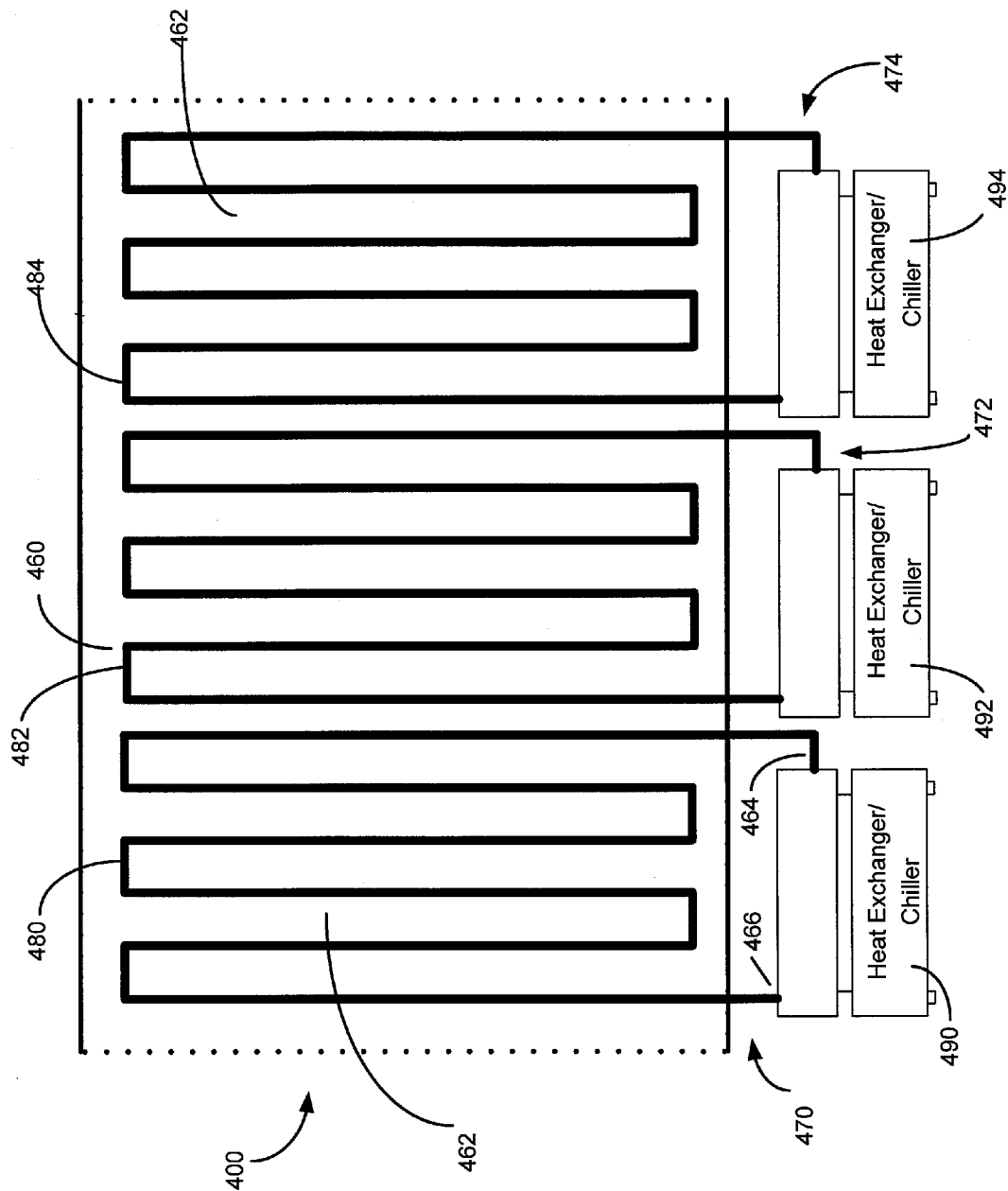
FIG. 4 is a schematic diagram of an exemplary cooling apparatus on a warm bore surface in accordance with an embodiment.

FIG. 4 is a schematic diagram of an exemplary cooling apparatus 400 on a warm bore surface in accordance with an embodiment. FIG. 4 shows an exploded view of the inside surface of the warm bore. In FIG. 4, three cooling circuits 470, 472, 474 are shown, however, more cooling circuits or fewer cooling circuits may be used in various embodiments. The number of cooling circuits used may be determined based on the flow rates and the temperature of the coolant necessary to remove the appropriate amount of heat from the warm bore. Each cooling circuit 470, 472, 474 includes a cooling tube 480, 482, 484 and a heat exchanger/chiller 490, 492, 494, respectively. The number of windings (or turns) in the cooling tubes, the shape of the cooling tubes and the number of heat exchanger/chillers are chosen to remove sufficient heat from the warm bore to keep the temperature of the warm bore constant. The cooling tubes 480, 482, 484 are attached to an inner surface 460 of a warm bore. The cooling tubes 480, 482, 484 may be attached to the inner diameter 460 of the warm bore by various methods including, but not limited to, welding or using an adhesive. Cooling tubes 480, 482, 484 may be, for example, plastic or metallic piping configured to carry a coolant. Alternatively, the cooling tubes may be a hollow conductor configured to carry both a coolant and an electrical current. The windings (or turns) of each cooling tube 480, 482, 484 may be arranged in an axial or other pattern. In FIG. 4, the pattern shown of each cooling tube consists of several axial turns. A space 462 between the windings (or turns) of the cooling tubes 480, 482, 484 may be filled with a thermally conductive epoxy that facilitates the removal of heat away from the warm bore surface 460 and to the cooling tubes 480, 482, 484.

Each cooling tube 480, 482, 484 is connected to a heat exchanger/chiller 490, 492, 494, respectively. Each heat exchanger/chiller 490, 492, 494 may be located remotely from the magnet assembly (200, 300), for example, the heat exchanger/chiller may be located in an equipment room while the magnet assembly (200, 300) is located in a separate scan room. The heat exchanger/chiller 490, 492, 494 is configured to supply a coolant to the corresponding cooling tube 480, 482, 484. For example, in cooling circuit 470, a coolant is provided from a heat exchanger/chiller 490 via an outlet 466 to cooling tube 480. The coolant, for example, a liquid coolant such as water, ethylene or a propylene glycol mixture, is pumped through the cooling tube 480 and returns to the heat exchanger/chiller 490 via an inlet 464. The liquid coolant absorbs heat from the warm bore as it circulates through the cooling tubes 480, 482, 484 and transports the heat to the corresponding remote heat exchanger/chiller 490, 492, 494, respectively. The heat may then be rejected to the atmosphere by way of the heat exchanger/chiller 490, 492, 494.

Figure 5:
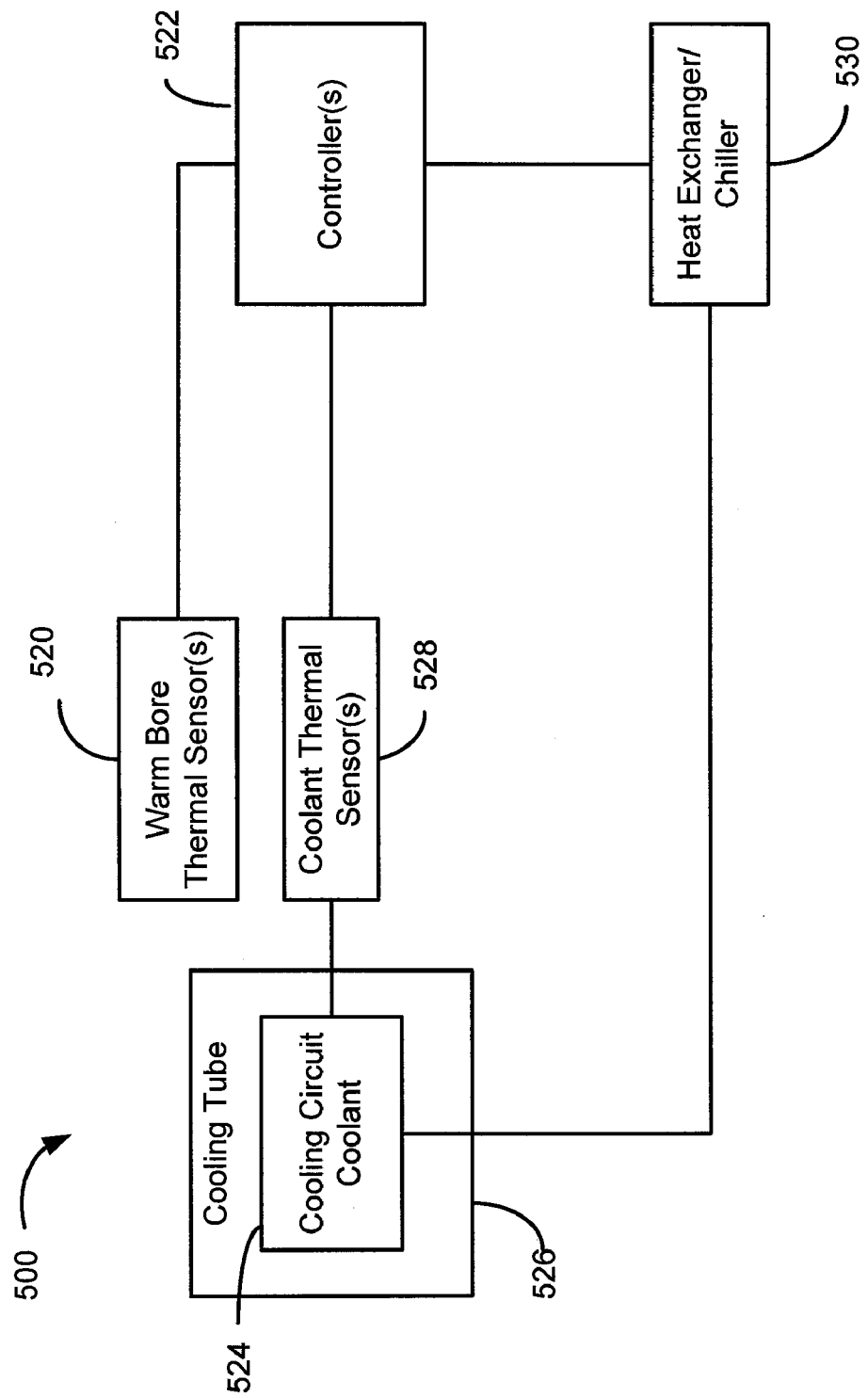
FIG. 5 is a schematic block diagram of a system for controlling a temperature of a warm bore of a superconducting magnet in a magnetic resonance imaging (MRI) system in accordance with an embodiment.

Heat exchanger/chillers 490, 492, 494 are coupled to a controller 522 (shown in FIG. 5). The cooling provided by the cooling circuits 470, 472, 474 is controlled to maintain a constant warm bore temperature. FIG. 5 is a schematic block diagram of a system for controlling the temperature of a warm bore of a superconducting magnet in accordance with an embodiment. The system 500 is compatible with the magnet assemblies and MRI system as described above with respect to FIG. 1-3 or any similar or equivalent magnet assemblies or MRI system. The system 500 includes a plurality of warm bore thermal sensors 520, at least one coolant thermal sensor 528, at least one controller 522, at least one heat exchanger/chiller 530 and cooling circuit coolant 524 in at least one cooling tube 526. The heat exchanger/chiller 530, coolant 524 and cooling tube 526 may be part of a cooling circuit 470, 472, 474 as shown in FIG. 4.

Returning to FIG. 5, a plurality of warm bore thermal sensors 520 are attached to a surface of the warm bore. In FIG. 2, a plurality of warm bore thermal sensors 220 are shown positioned on the warm bore 218. While four warm bore thermal sensors 220 are shown, it should be understood that fewer or more thermal sensors 220 may be used. Returning to FIG. 5, the warm bore thermal sensors 520 may be, for example, thermocouples, thermistors, resistance temperature devices (RTDs), etc. In one embodiment, the RTD is an RTD with a non-metallic housing (e.g., a four wire platinum, Teflon encased RTD) to minimize the amount of metal in the RTD. In another embodiment, the RTD may include a shorting capacitor to short out RF noise on the RTD. The warm bore thermal sensors 520 are positioned on the warm bore surface to obtain (or model) an average temperature for the warm bore. For example, in various embodiments, a warm bore thermal sensor 520 may be positioned at four or eight locations on the warm bore surface. The location of each of the warm bore thermal sensors 520 is chosen to sufficiently track the average temperature of the warm bore. The warm bore thermal sensors 520 provide a signal or signals to a controller (or controllers) 522 that indicate the temperature at the corresponding location on the warm bore.

A coolant thermal sensor (or sensors) 528 may be positioned in the cooling tube 526 (mounted on a surface of the warm bore) to measure and monitor the temperature of the coolant 524 in the cooling circuit. The coolant thermal sensor(s) 528 may be a sensor such as a thermocouple, a thermistor, etc. In one embodiment, a first coolant thermal sensor 528 may be positioned at the inlet 464 (shown in FIG. 4) of the heat exchanger/chiller 520 and a second coolant thermal sensor 528 may be positioned at the outlet 466 (shown in FIG. 4) of the hat exchanger/chiller 530. Each coolant thermal sensor 528 provides a signal (or signals) indicating the temperature of the coolant 524 to the controller 522. Controller(s) 522 may be, for example, integrated in a computer system 20 (shown in FIG. 1) or system control 32 (shown in FIG. 1) of the MRI system. Based on the temperature of the warm bore and the temperature of the coolant, controller 522 provides a control signal to heat exchanger/chiller 530 which in turn adjusts the temperature of the coolant 524 to maintain a constant predetermined temperature of the warm bore. In one embodiment, the temperature difference between the inlet 464 (shown in FIG. 4) and the outlet 466 (shown in FIG. 4) of the heat exchanger/chiller 530 may be monitored and the temperature of the coolant 524 provided to the cooling tube 526 adjusted by the heat exchanger/chiller 530 to maintain a constant warm bore temperature. In another embodiment, the temperature of the coolant at the outlet of the heat exchanger/chiller may be changed based on the temperature of the coolant at the inlet of the heat exchanger/chiller to keep the temperature of the warm bore constant. By controlling the coolant temperature to maintain a constant warm bore temperature, the temperature induced change in permeability of the warm bore is reduced or eliminated and will minimize the drift in the main magnetic field.

Returning to FIG. 2, the drift in the main magnetic field, Bo, may also be controlled by reducing the permeability of the magnet warm bore 218. As mentioned, the warm bore 218 is typically made of metal such as stainless steel. The warm bore 218 can be annealed before assembly into the magnet to reduce the permeability of the metal (e.g., stainless steel) used for the warm bore 218. To anneal the warm bore 218, the warm bore 218 is heated to a temperature in the range of 1850-2050° F. for a predetermined period of time, for example, thirty minutes. The warm bore 218 is then quickly cooled to room temperature. Annealing changes the material properties of the metal used for the warm bore 218 including lowering the permeability of the metal used for the warm bore 218. As a result of the reduced permeability, the drift in the main magnetic field caused by heating of the warm bore 218 (e.g., from the gradient coil) is reduced. Warm bore annealing can also remove any increase in permeability caused by cold working of the metal during the manufacturing process. In addition, annealing can reduce the permeability of welds used in manufacturing the warm bore 218 and the effect the welds have on the homogeneity of the main magnetic field.

This written description uses examples to disclose the invention, including the best mode, and also to enable any person skilled in the art to make and use the invention. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims. The order and sequence of any process or method steps may be varied or re-sequenced according to alternative embodiments.

Many other changes and modifications may be made to the present invention without departing from the spirit thereof. The scope of these and other changes will become apparent from the appended claims.

What is claimed is:

1. An apparatus for controlling a temperature of a warm bore of a superconducting magnet in a magnetic resonance imaging (MRI) system, the apparatus comprising:
    a cooling tube mounted on a surface of the warm bore and configured to transport a coolant;
    a chiller coupled to the cooling tube and configured to provide the coolant to the cooling tube, the coolant having a temperature; and
    a controller coupled to the chiller and configured to provide a control signal to the chiller to control the temperature of the coolant.

2. An apparatus according to claim 1, wherein the chiller is configured to adjust the temperature of the coolant to maintain a constant temperature of the warm bore.

3. An apparatus according to claim 1, wherein the cooling tube comprises a plurality of turns.

4. An apparatus according to claim 3, further comprising a thermally conductive epoxy deposited between each turn of the cooling tube.

5. An apparatus according to claim 1, wherein the cooling tube is a hollow metallic conductor.

6. An apparatus according to claim 1, wherein the cooling tube is a hollow plastic tube.

7. An apparatus according to claim 1, wherein the chiller comprises an inlet and an outlet, the apparatus further comprising a first coolant thermal sensor positioned at the inlet of the chiller and a second coolant thermal sensor positioned at the outlet of the chiller.

8. An apparatus according to claim 7, wherein the temperature of the coolant provided by the chiller is adjusted based on an inlet temperature measured by the first coolant thermal sensor.

9. An apparatus according to claim 7, wherein the temperature of the coolant provided by the chiller is adjusted based on a difference between an outlet temperature measured by the second coolant thermal sensor and an inlet temperature measured by the first coolant thermal sensor.

10. An apparatus according to claim 1, further comprising a plurality of warm bore thermal sensors positioned on the surface of the warm bore and coupled to the controller.

11. An apparatus according to claim 10, further comprising at least one coolant thermal sensor positioned in the cooling tube.

12. An apparatus according to claim 10, wherein the plurality of warm bore thermal sensors are positioned on the surface of the warm bore to track an average temperature of the warm bore.

13. An apparatus according to claim 1, wherein the cooling tube is positioned between the warm bore and a gradient coil of the MRI system.

14. An apparatus according to claim 1, wherein the cooling tube is not coupled with a gradient coil of the MRI system.

15. An apparatus according to claim 1, wherein the warm bore comprises an annealed metal.

16. A magnet assembly for a magnetic resonance imaging (MRI) system, the magnet assembly comprising:
    a superconducting magnet comprising a magnet vessel containing at least one superconducting coil and having an inner diameter surface; and
    a cooling apparatus mounted to and in thermal contact with the inner diameter surface of the magnet vessel.

17. A magnet assembly according to claim 16, wherein the cooling apparatus comprises at least one cooling circuit configured to maintain a constant temperature of the inner diameter surface of the magnet vessel.

18. A magnet assembly according to claim 17, wherein the at least one cooling circuit comprises:
   a cooling tube mounted on the inner diameter surface of the magnet vessel and configured to transport a coolant; and
   a chiller coupled to the cooling tube and configured to provide the coolant to the cooling tube, the coolant having a temperature.

19. A magnet assembly according to claim 18, wherein the chiller is configured to adjust the temperature of the coolant to maintain the constant temperature of the inner diameter surface of the magnet vessel.

20. A magnet assembly according to claim 16, wherein the cooling apparatus comprises a plurality of cooling circuits configured to maintain a constant temperature of the inner diameter surface of the magnet vessel, and further comprising a plurality of chillers, wherein each cooling circuit comprises a separate cooling tube connected to a corresponding one of the chillers.

* * * * *